US012394682B2

(12) United States Patent
Akkinepally

(10) Patent No.: US 12,394,682 B2
(45) Date of Patent: Aug. 19, 2025

(54) ORGANIC PASSIVATION FOR FINE PITCH ARCHITECTURES

(71) Applicant: Intel Corporation, Santa Clara, CA (US)

(72) Inventor: Praneeth Kumar Akkinepally, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 17/471,623

(22) Filed: Sep. 10, 2021

(65) Prior Publication Data

US 2023/0085196 A1    Mar. 16, 2023

(51) Int. Cl.
*H01L 23/29* (2006.01)
*H01L 21/56* (2006.01)
*H01L 23/00* (2006.01)
*H01L 23/31* (2006.01)
*H01L 25/00* (2006.01)
*H01L 25/065* (2023.01)

(52) U.S. Cl.
CPC .......... *H01L 23/293* (2013.01); *H01L 21/56* (2013.01); *H01L 23/3135* (2013.01); *H01L 23/3142* (2013.01); *H01L 24/19* (2013.01); *H01L 24/20* (2013.01); *H01L 25/0657* (2013.01); *H01L 25/50* (2013.01); *H01L 2224/2101* (2013.01)

(58) Field of Classification Search
CPC ... H01L 23/293; H01L 21/56; H01L 23/3135; H01L 23/3142; H01L 24/19; H01L 24/20; H01L 25/0657; H01L 25/50; H01L 2224/2101
See application file for complete search history.

(56) References Cited

U.S. PATENT DOCUMENTS

| | | | |
|---|---|---|---|
| 2005/0067711 A1* | 3/2005 | Opheim | H01L 23/49827 257/E23.067 |
| 2008/0137263 A1* | 6/2008 | Min | H01L 27/016 257/E21.52 |
| 2019/0057932 A1* | 2/2019 | Wu | H01L 23/04 |
| 2021/0225809 A1* | 7/2021 | Yu | H10N 50/01 |
| 2022/0223530 A1* | 7/2022 | Yu | H01L 25/0652 |

* cited by examiner

*Primary Examiner* — Andres Munoz
*Assistant Examiner* — Neil R Prasad
(74) *Attorney, Agent, or Firm* — Akona IP PC

(57) ABSTRACT

An integrated circuit (IC) package includes a package substrate, a first die over the package substrate, a stack of a first material and a second material over the first die, where the first material is between the first die and the second material and the second material includes an organic passivation material, interconnect structures including vias on the first die and extending through the first and second materials and conductive bumps on the second material, and a second die over the first die and connected to the first die via the interconnect structures, where a taper angle between an inner portion of a side wall of one of the vias and a plane parallel to a bottom opening of the one of the vias is less than or equal to 90 degrees.

20 Claims, 16 Drawing Sheets

US 12,394,682 B2

ORGANIC PASSIVATION FOR FINE PITCH ARCHITECTURES

TECHNICAL FIELD

The present disclosure relates to integrated circuit (IC) devices and assemblies. More specifically, it relates to using organic passivation for packaging architectures having a fine bump pitch.

BACKGROUND

As the demand for higher bandwidth and higher input/output (I/O) for die-to-die (DTD) interconnects increases, bump pitch (BP) has continued to shrink across various packaging architectures, such as die-on-wafer and die-on-organic package architectures, to keep pace with the demand. The decrease in BP is accompanied by a corresponding decrease in bump critical dimensions (CDs), e.g., bump diameters, from C4 bumps to so-called "microbumps."

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2I are schematic cross-sectional illustrations of various stages in an example process for fabricating a package component including an organic passivation layer on which DTD interconnect bumps are formed, according to some embodiments of the present disclosure.

DETAILED DESCRIPTION

Overview

Figure 1:
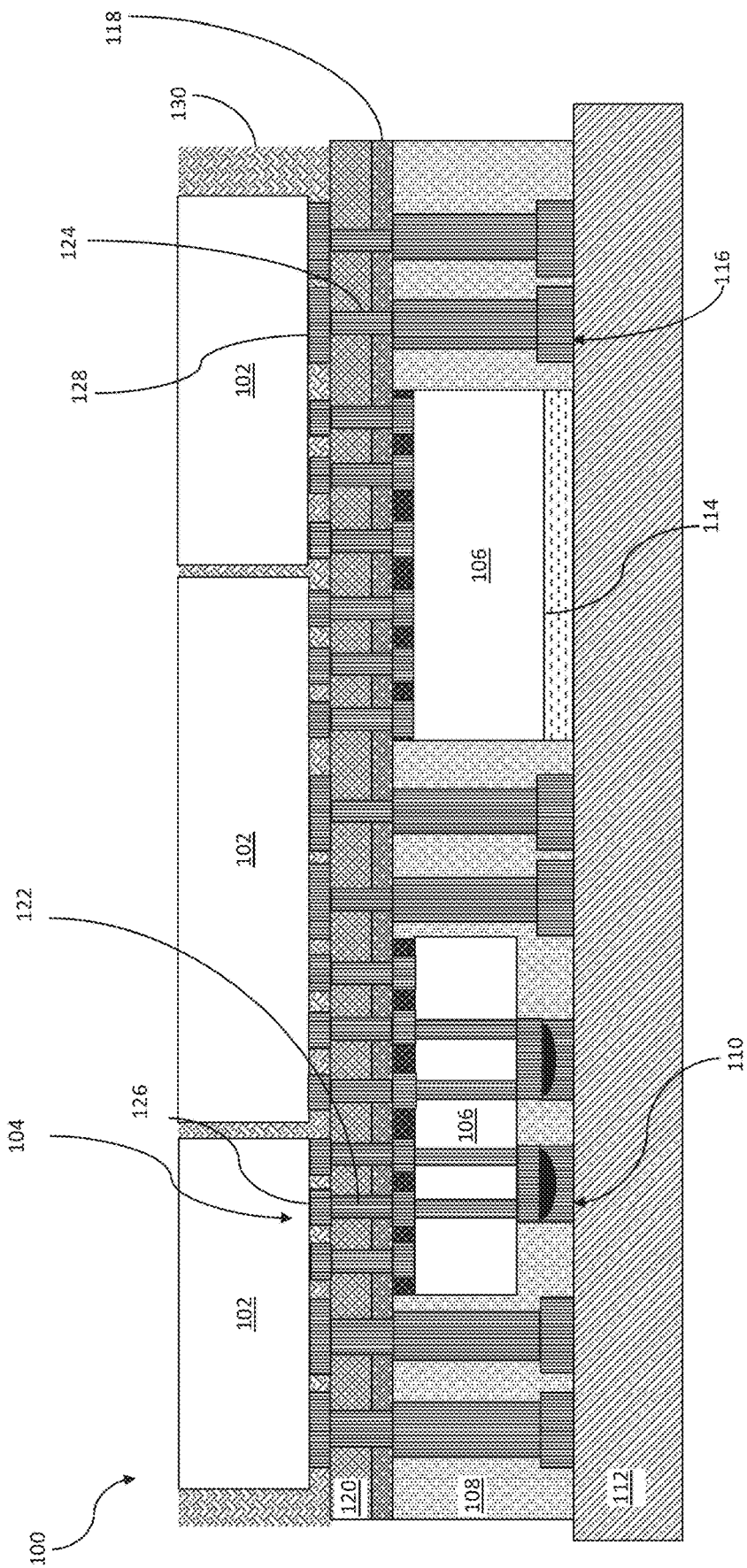
FIG. 1 is a schematic cross-sectional view of an example package component including an organic passivation layer on which DTD interconnects are located, according to some embodiments of the present disclosure.

For purposes of illustrating embodiments described herein, it is important to understand phenomena that may come into play during packaging of IC structures. The following foundational information may be viewed as a basis from which the present disclosure may be properly explained. Such information is offered for purposes of explanation only and, accordingly, should not be construed in any way to limit the broad scope of the present disclosure and its potential applications.

As bump CDs have continued to shrink, the bumping process has moved from bump-on-organic passivation materials, such as polyimide (PI) and polybenzoxazole (PBO) to bump-on-inorganic passivation materials, such as silicon nitride (SiN) or silicon oxide ($SiO_x$), primarily due to the fact that the smaller via CDs necessitated by fine pitch (e.g., less than 55 micrometer) architectures can be achieved more readily using inorganic passivation materials than using organic passivation materials. In particular, due to current lithography limitations, vias formed through organic passivation materials are more tapered than those formed through inorganic passivation materials, such that the diameter of the top opening of an organic passivation via may be 3-4 micrometer larger than the bottom opening of the via. In addition, there is currently no known method of enabling PI for a CD of less than about 7 micrometer. The use of inorganic passivation is not without attendant shortcomings, including increased risk of delamination from assembly materials, such as underfill epoxy (CUF), mold underfill (MUF) and other sealants, for example. Additionally, a coefficient of thermal expansion (CTE) mismatch between die and package for die-on-organic package architectures may result in significantly higher stress and poor adhesion, resulting in delamination of bumps formed on an inorganic passivation layer.

In one aspect of the present disclosure, an example of an IC package includes a package substrate, a first die over the package substrate, a stack of a first material and a second material over the first die, where the first material is between the first die and the second material and the second material includes an organic passivation material, interconnect structures including vias on the first die and extending through the first and second materials and conductive bumps on the second material, and a second die over the first die and connected to the first die via the interconnect structures, where a taper angle between an inner portion of a side wall of one of the vias and a plane parallel to a bottom opening of the one of the vias is less than or equal to 90 degrees.

As used herein, the term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers. In addition, the term "dispose" as used herein refers to position, location, placement, and/or arrangement rather than to any particular method of formation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and where is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments. Further, the structures shown in the figures may take any suitable form or shape according to material properties, fabrication processes, and operating conditions.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional illustration of a package 100, according to some embodiments of the present disclosure. As shown in FIG. 1, package 100 may include one or more IC dies, represented in FIG. 1 by dies 102, each of which may include electrical devices including but not limited to processing units (XPUs), electronic ICs (EICs), and memory, for example. Dies 102 may comprise a semiconductor material including, for example, N-type or P-type materials. Dies 102 may include, for example, a crystalline substrate formed using a bulk silicon (or other bulk semiconductor material) or a semiconductor-on-insulator (SOI, e.g., a silicon-on-insulator) structure. In some embodiments, dies 102 may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, dies 102 may comprise a non-crystalline material, such as polymers. In some embodiments, dies 102 may be inhomogeneous, including a carrier material (such as glass or silicon carbide) as a substrate with a thin semiconductor layer over which is an active side of the die 102. Although a few examples of the material for dies 102 are described here, any material or structure that may serve as a foundation upon which IC circuits and structures as described herein may be built falls within the spirit and scope of the present disclosure as dies 102.

In the illustrated embodiment, dies 102 may be electrically coupled by way of interconnects 104 to one or more dies 106 situated in a layer 108. Layer 108 may be formed from dielectric such as mold compound or from other materials such as silicon and may also be referred to as an interposer regardless of the material. In order to readily distinguish dies 102 from dies 106, dies 102 may be referred to herein as "top dies" or alternatively as "second-level dies," while dies 106 may be referred to herein as "embedded dies" or alternatively as "first-level dies." Interconnects 104 may comprise DTD interconnects along with associated conductive traces, planes, vias, and pads enabling electrical coupling between top dies 102 and embedded dies 106. Note that some component parts of interconnects are shown in FIG. 1 but are not labeled separately so as not to clutter the drawing. In some embodiments, interconnects 104 may comprise flip-chip interconnects that enable package 100 to achieve a smaller footprint and higher die-to-package support (DTPS) connection density than could be achieved using conventional wire-bond techniques.

In addition, by co-packaging top dies 102 with embedded dies 106 using interconnects 104 in a high-density configuration, input/output power can be reduced by limiting electrical signaling to intra-package distances while also reducing cost and signal loss (among other advantages). The three-dimensional (3D) stacked architecture can lower power requirements for data transfer, for example, to 2-3 picojoules/bit. The high-density configuration can also enable serialization of electromagnetic signals in top dies 102, further allowing fewer number of electrical interconnects with embedded dies 106. In some example embodiments, interconnects 104 may be formed with a high-density pitch between approximately 18 and 36 micrometer. In an example embodiment, interconnects 104 may be formed with a high-density pitch of 25 micrometer.

In some embodiments, one or more of embedded dies 106 may comprise an IC configured to electrically integrate with one or more of top dies 102 to achieve an intended functionality of package 100. For example, one or more of embedded dies 106 may be an Application Specific IC (ASIC), such as a switch circuit or driver/receiver circuit used in optical communication systems. In some embodiments, one or more of embedded dies 106 may comprise a bridge circuit, for example, including an embedded multi-die interconnect bridge having appropriate circuitry on/in a semiconductor substrate to connect at silicon-interconnect speeds with a small footprint of 2.5D packages. In some embodiments, on or more of embedded dies 106 may comprise active components, including one or more transistors, voltage converters, trans-impedance amplifiers (TIA), clock and data recovery (CDR) components, microcontrollers, etc. In some embodiments, embedded dies 106 may comprise passive circuitry sufficient to enable interconnection to top dies 102 and other components in package 100 without any active components. In some embodiments, embedded dies 106 may extend under a substantial area of top dies 102; in other embodiments, embedded dies 106 may overlap with top dies 102 along one or more edges. In various embodiments, embedded dies 106 and top dies 102 may overlap sufficiently to enable disposing interconnects 104 with a desired pitch and number of interconnections that enable package 100 to function appropriately.

In various embodiments, interposer 108 may comprise any suitable insulating material, such as an organic material, for example, a polymer with fillers. In some embodiments, interposer 108 may be formed of a single layer with metallization circuitry on top and bottom surfaces; in other embodiments, interposer 108 may comprise a plurality of layers with metallization circuitry between layers. The 3D architecture as illustrated can allow a smaller footprint overall for package 100.

Interconnects 110 comprising DTPS interconnects, and associated conductive traces, planes, vias, and pads may provide electrical coupling between one or more of embedded dies 106 and a package support, which may also be referred to herein as a package substrate, 112. One or more of embedded dies 106 may alternatively be coupled to package support 112 using other means for electrically and/or physically coupling an IC to a package support, such as with die attach film (DAF) 114. In various embodiments, package support 112 may comprise a single or multi-layered insulating material with metallization including planes, traces, vias, and passive components (e.g., inductors, capacitors) within the insulating material and/or on the surfaces. Package support 112 may comprise ceramic (e.g., alumina) and/or organic material (e.g., epoxy based FR4, resin based bismaleimide triazine (BT), or polyimide) and may be formed in various varieties including rigid and tape. Package support 112 may provide mechanical base support and appropriate interfaces to access components in package 100 electrically. Interconnects 116 comprising DTPS interconnects, and associated conductive traces, planes, vias, pillars, and pads may provide electrical coupling between top dies 102 and package support 112.

Interconnects 110 and 116 may comprise any suitable interconnection, including flip-chips and ball grid array (BGA) with corresponding metallization, pads and vias, including through-silicon-vias (TSVs) through embedded dies 106 or through-hole vias also called through-mold-vias (TMVs) through interposer 108. Note that the shapes of various interconnects shown in the figure are merely for illustrative purposes and are not to be construed as limitations. The shapes of interconnects 104, 110, and/or 116, for example, may result from natural processes occurring during solder reflow. The shapes may depend on material viscosity in liquid state, temperatures of processing, surface tension forces, capillary action, and other mechanisms beyond the scope of the present disclosure. Interconnects 104, 110, and 116, can enable a stacked packaging architecture that enables low power, low loss, high-speed electrical signals between top dies 102 and embedded dies 106. Such packaging architectures allow for IC chips to communicate with each other horizontally or vertically, permitting smaller footprint, higher speeds, and reduced power usage for package 100.

As illustrated in FIG. 1, a layer 118, which in certain embodiments may include an inorganic material, is between interposer 106 and top dies 102. In some embodiments, passivation may be a function of layer 118. In accordance with features of embodiments described herein, and for purposes that will be described in greater detail hereinbelow, an organic passivation layer 120 is between interposer 106 (and above layer 118) and top dies 102. As will be described in greater detail below, in accordance with features of embodiments described herein, interconnects 104, 116, may include vias 122, 124 through organic passivation layer 120 and associated bumps 126, 128, on organic passivation layer 120. The thicknesses of the layers 118, 120 will be driven by the product application; however, the organic passivation layer 120 may be thicker than the layer 118. In certain embodiments, the thickness of organic passivation layer 120 may be 3-5 micrometer, while the thickness of layer 118 may be 1-2.5 micrometer.

It will be recognized that one more levels of underfill and/or solder resist (e.g., organic polymer material such as benzotriazole, imidazole, polyimide, or epoxy) may be provided in package 100 and are not labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations. In some embodiments, solder resist may be a liquid or dry film material including photo-imagable polymers. In some embodiments, solder resist may be non-photo-imagable.

Referring again to FIG. 1, top dies 102 may be encased by a mold 130. In some embodiments, mold 130 may extend to the surfaces of top dies 102 distant from interposer 108 without overlapping on such surfaces, thereby exposing top dies 102 for direct connection of heat sinks, identifying markers, etc. In some embodiments, mold 130 may cover the surfaces of top dies 102 distant from interposer 108.

Although not specifically shown in all of the present illustrations in order to not clutter the drawings, when DTD or DTPS interconnects are described, a surface of a first IC (including top dies 102) may include a first set of conductive contacts, and a surface of a second IC (including top dies 102) or a package support may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same. In some embodiments, the DTPS interconnects disclosed herein may have a pitch between about 80 micrometer and 300 micrometer, while the DTD interconnects disclosed herein may have a pitch between about 7 micrometer and 55 micrometer. In an example embodiment, some DTD interconnects have a pitch of 25 micrometer.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, SiN, or silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the ICs on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects may be solder interconnects that include a solder with a higher melting point than a solder included in some or all of the DTPS interconnects. For example, when the DTD interconnects are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package support on either side of a set of DTPS interconnects. In particular, the differences in the material composition of ICs and package supports may result in differential expansion and contraction of the ICs and package supports due to heat generated during operation (as well as the heat applied during various manufacturing operations). To mitigate damage caused by this differential expansion and contraction (e.g., cracking, solder bridging, etc.), the DTPS interconnects in any of the packages as described herein may be formed larger and farther apart than DTD interconnects, which may experience less thermal stress due to the greater material similarity of the pair of dies on either side of the DTD interconnects.

Various conductive contacts used in package 100, for example, conductive contacts that form part of interconnects 104, 110, 116, may include multiple layers of material that may be selected to serve different purposes. In some embodiments, the conductive contacts may be formed of aluminum, and may include a layer of gold (e.g., with a thickness of less than 1 micrometer) between the aluminum and adjacent interconnects to limit surface oxidation of the contacts and improve adhesion with adjacent contacts. Alternate materials for the surface finish include palladium, platinum, silver, and tin. In some embodiments, the conductive contacts may be formed of aluminum, and may include a layer of a barrier metal such as nickel, as well as a layer of gold, or other appropriate material, wherein the layer of barrier metal is disposed between aluminum and gold, and the layer of gold is disposed between the barrier metal and the adjacent interconnect. In such embodiments, the gold, or other surface finish, may protect the barrier metal surface from oxidation before assembly, and the barrier metal may limit diffusion of solder from the adjacent interconnects into aluminum. In many embodiments, surfaces of top dies 102 and embedded dies 106 in contact with solder may be covered by a suitable solder mask material (not shown) that prevents solder from melting and bridging adjacent contacts during solder reflow.

In various embodiments, more or fewer elements described above may be included in package 100, compared to what is shown in FIG. 1. In some embodiments, conductive metallization lines may extend into and out of the plane of the drawing, providing conductive pathways to route electrical to and/or from various elements in package 100. The conductive vias and/or lines that provide conductive pathways in/on the package 100 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as oxide material or nitride material, may insulate various structures in the conductive pathways from proximate structures, and/or may serve as etch stops during fabrication. In some embodiments, additional layers, such as diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

Note that in the figure, interconnects 104, 110, 116, may be shown aligned with vias merely for illustrative purposes. In various embodiments, appropriate conductive traces may allow for some interconnects, such as solder balls, to be located away from vias and vice versa. In some embodiments, a redistribution layer comprising at least one layer of an insulating material and metallization on top dies 102 and embedded dies 106 may enable any desired placement of solder balls with respect to vias and other circuitry. In a general sense, interconnect structures may be arranged within package 100 to route electrical signals according to a wide variety of designs. During operation of package 100, electrical signals (such as power, input/output (I/O) signals, including various control signals for external and internal control of dies 102) may be routed to and/or from dies 102 through the conductive contacts and conductive pathways of package 100.

Note that FIG. 1 is intended to show relative arrangements of the components within their assemblies, and that, in general, such assemblies may include other components that are not illustrated (e.g., various interfacial layers or various other components related to functionality, electrical connectivity, or thermal mitigation). For example, in some further embodiments, the assemblies as shown in FIG. 1 may include multiple top dies 102 and/or embedded dies 106, along with other electrical components.

Additionally, although some components of the assemblies are illustrated in FIG. 1 as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In various embodiments, any of the features discussed with reference to FIG. 1 herein may be combined with any other features to form a package as described herein, for example, to form a modified package. Some such combinations are described above, but, in various embodiments, further combinations and modifications are possible.

Example Methods

FIGS. 2A-2I are schematic illustrations of various process steps associated with techniques for forming fine pitch bumps (e.g., less than 40 micrometer) on an organic passivation layer, such as in connection with package 100. Although FIGS. 2A-2I illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 2A-2I may be modified in accordance with the present disclosure to fabricate other embodiments and/or components of package 100 as disclosed herein.

Figure 2A:
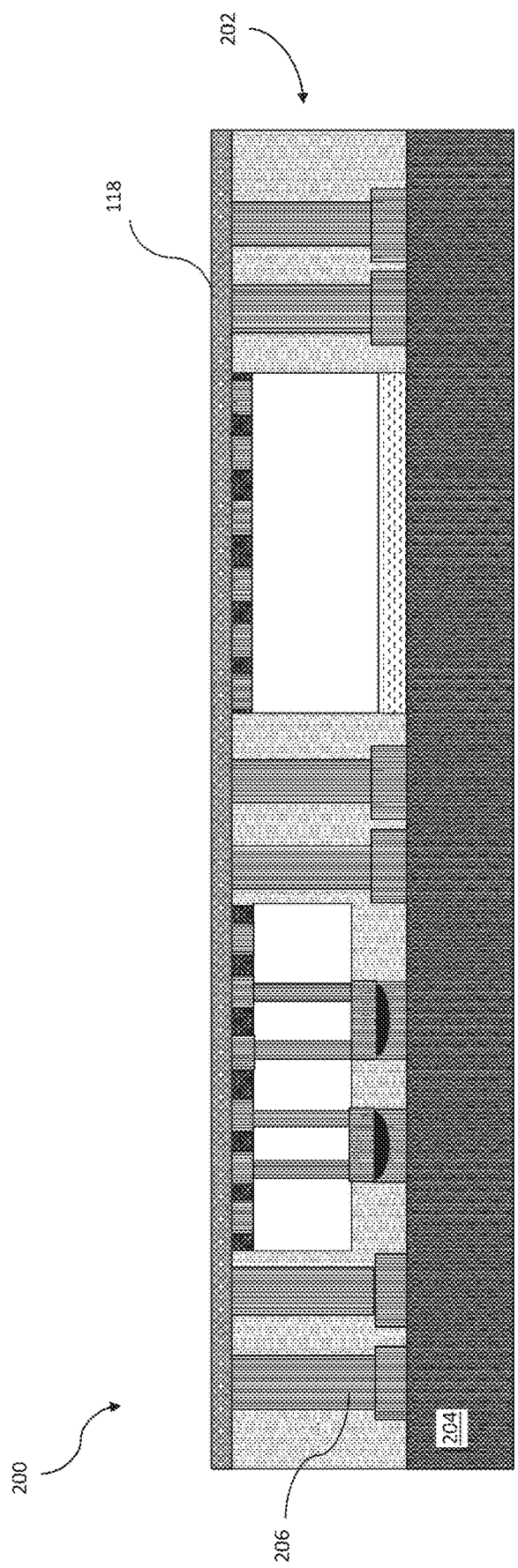

FIG. 2A illustrates a microelectronics assembly 200 (alternatively referred to herein as simply "assembly") including an IC structure 202, which in the illustrated example includes a carrier wafer 204 that has been plated or otherwise deposited with conductive material, such as copper, to generate traces (not shown), planes (not shown), and pillars. Any suitable manufacturing technique (such as additive, subtractive, semi-additive, etc.) may be used to manufacture IC structure 202. In various embodiments, the metallization may be formed using any known process in the art, including electroplating, photolithography, etc. In various embodiments, carrier wafer 204 may comprise a semiconductor material. In some embodiments, carrier wafer 204 may comprise any rigid, non-conductive material, such as alumina, that can provide mechanical support to the deposited metallization. In various embodiments, the metallization may comprise copper; in some embodiments, the metallization may comprise aluminum; in some embodiments, the metallization may comprise metal alloys of various compositions.

In certain embodiments, IC structure 202 may be referred to as a "base structure" and/or a "via support structure" and may comprise a carrier wafer 204 processed to top-most metal layer (such as copper or aluminum). Additionally, and/or alternatively, base structure comprising IC structure 202 may include an organic complex with or without embedded active or passive devices, a glass base with or without embedded active or passive devices, or a coreless package with a temporary carrier base with or without embedded active or passive devices. A coreless package is one that includes multiple high-density wiring layers (or "build-up layers") and that lacks a thick core layer included in conventional packages. In various embodiments, carrier structure 204 is optional and does not form a part of IC structure 202. In general, IC structure 202 may be any structure including a surface on which fine pitch interconnects may be formed in accordance with embodiments described herein.

It will be recognized that the starting surface of IC structure 202 may include a layer 118 that may or may not include inorganic material, including but not limited to SiN or silicon oxide. IC structure 202 may comprise a base complex of an organic package, as represented in the FIGS. Alternatively, IC structure 202 may be any other IC structure on which fine BP architectures (e.g., less than 55 micrometer) for forming interconnects are formed.

Figure 2B:
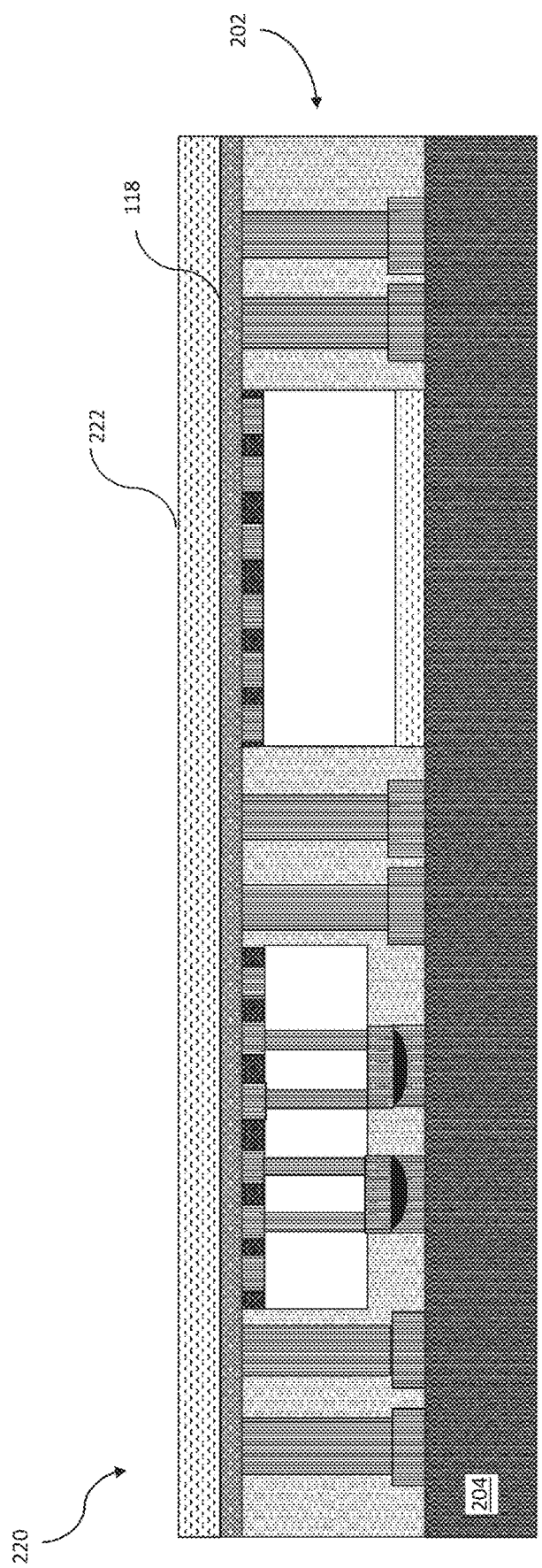

FIG. 2B illustrates an assembly 220 that includes assembly 200 (FIG. 2A) on which photoresist material 222 is deposited on layer 118. Deposition techniques could include, but are not limited to, spin-on coating, slit coating, or lamination, to name several possibilities. In certain embodiments, photoresist material 222 and materials comprising layer 118 are sufficiently etch-selective. As known in the art, two materials are said to be "sufficiently etch-selective" and/or have "sufficient etch selectivity" when etchants used to etch one material do not substantially etch the other, enabling selective etching of one material but not the other. Thickness of photoresist material 222 may be of any appropriate thickness for ensuring appropriate via height. In certain embodiments, thickness of photoresist material 222 is 3-7 micrometer.

Figure 2C:
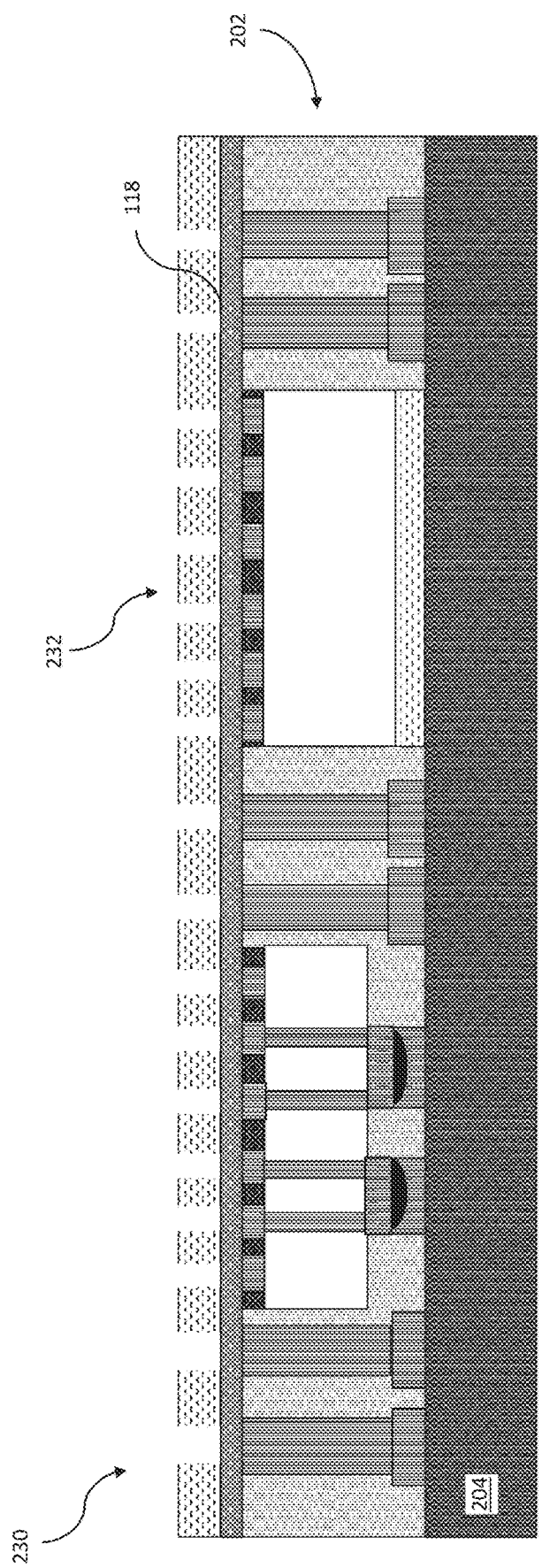

FIG. 2C illustrates an assembly 230 after photoresist material 222 on assembly 220 (FIG. 2B) has been patterned using one of any number of lithography techniques, including but not limited to exposure, development, etching, and/or cleaning, to create a patterned photoresist 232.

Figure 2D:
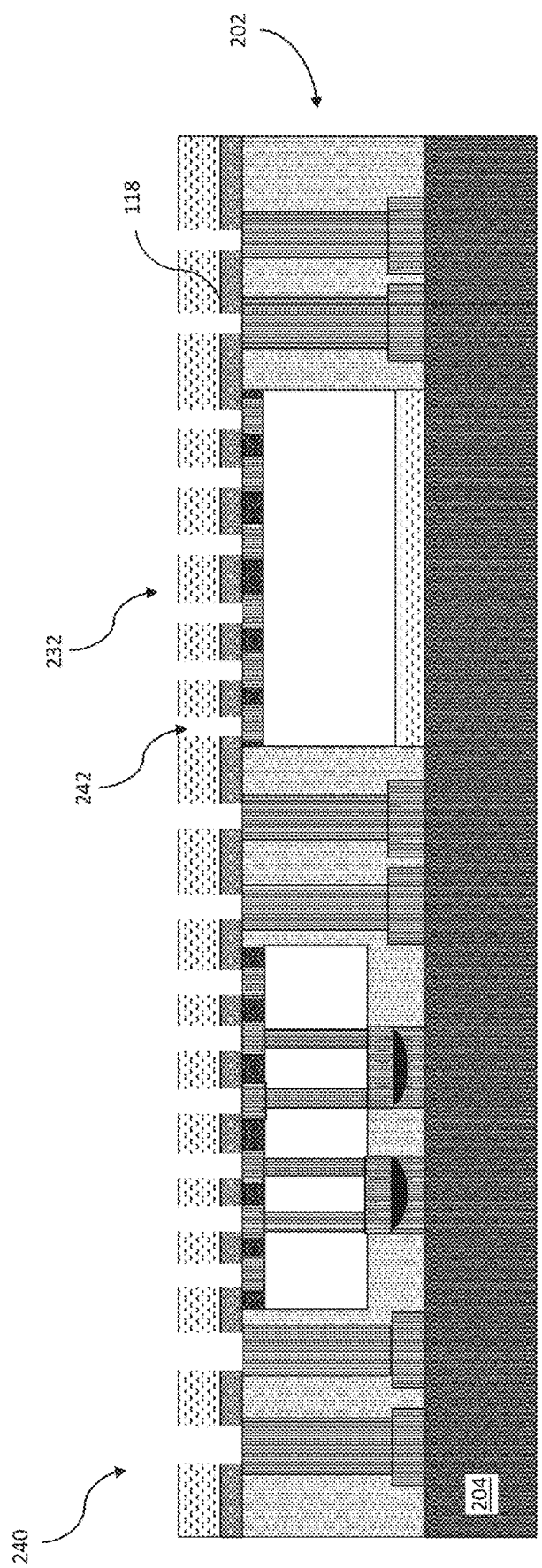

FIG. 2D illustrates an assembly 240 after patterned photoresist 232 is used as a mask to create openings 242 in layer 118 of assembly 230 (FIG. 2C). Openings 242 in layer 118 to may be created using techniques including but not limited to dry etch (such as radio frequency (RF) plasma, inductively-coupled plasma (ICP), reactive ion etching (RIE), C4 plasma, and/or argon plasma) techniques and/or wet etch (such as hydrofluoric acid (HF)-based or other chemical-based) techniques, for example.

Figure 2E:
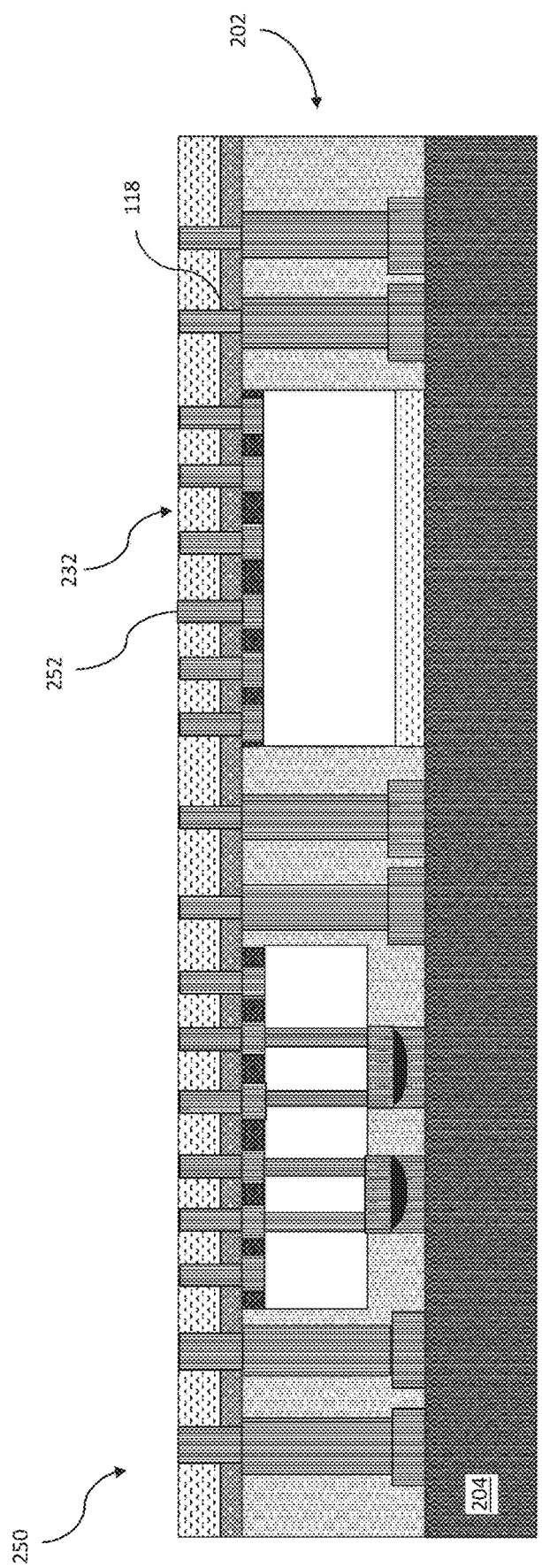

FIG. 2E illustrates an assembly 250 after openings 242 of assembly 240 (FIG. 2D) have been plated to create vias 252, which may correspond to vias 122, 124 (FIG. 1), for example. Plating of openings 242 may be performed using techniques including but not limited to electroplating of copper, plugging, and/or copper printing, for example.

Figure 2F:
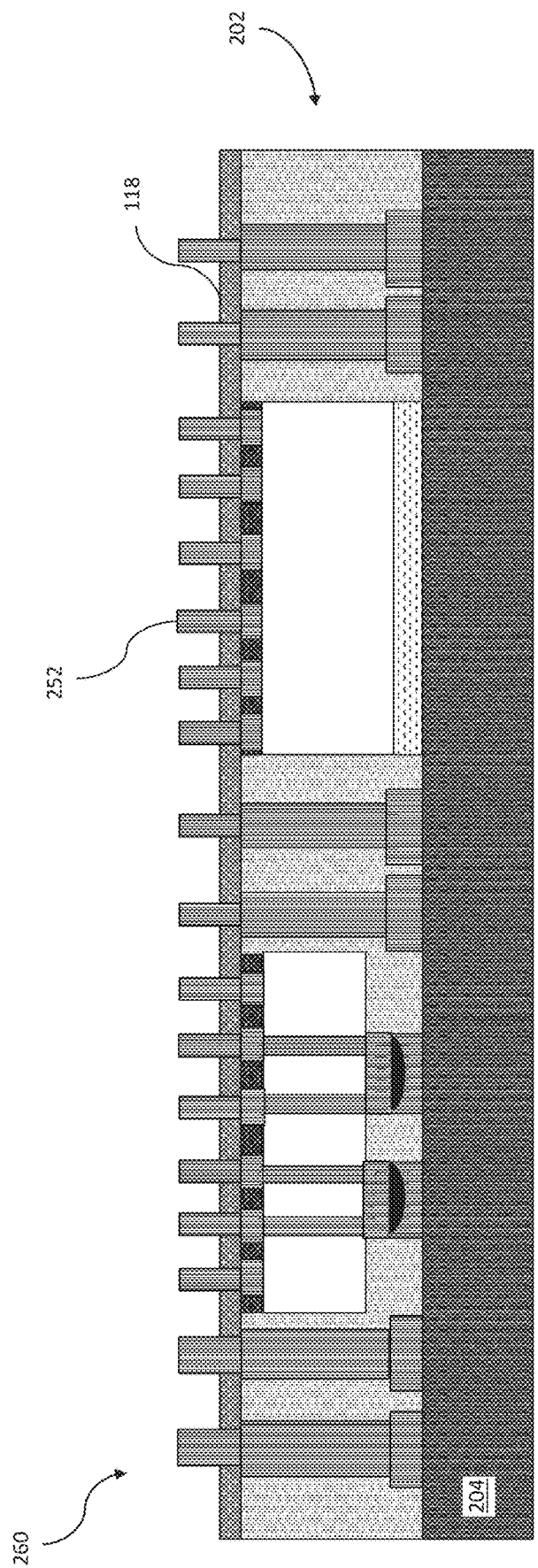

FIG. 2F illustrates an assembly 260 after photoresist material 222 has been stripped from assembly 250 (FIG. 2E) and a top surface has been cleaned as needed. As shown in FIG. 2F, vias 252 extend perpendicular to top surface of IC structure 202.

Figure 2G:
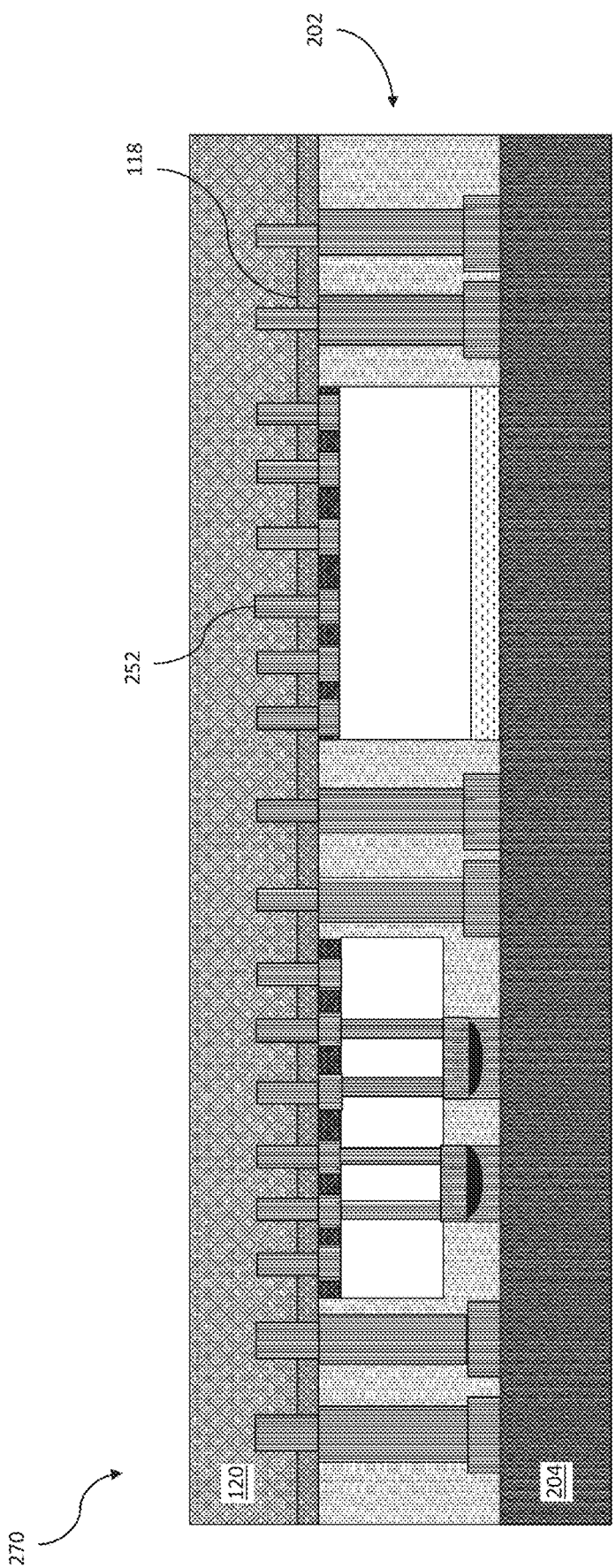

FIG. 2G illustrates an assembly 270 after organic passivation is deposited on assembly 260 (FIG. 2F) to create organic passivation layer 120. Organic passivation layer 120 may include or may not include PI, PBO, a photoresist, photo-definable organic dielectrics, solder mask/solder resist, and/or non-photo-definable organic dielectrics, such as build-up dielectric materials as required for a particular application. Deposition techniques may include but are not limited to spin-on coating, slit coating, and dry film lamination, for example. Notably, the properties of the material used for the organic passivation layer 120 may be independently selected as per application requirements, as the resulting properties are decoupled from the mechanical properties by the processes described herein.

Figure 2H:
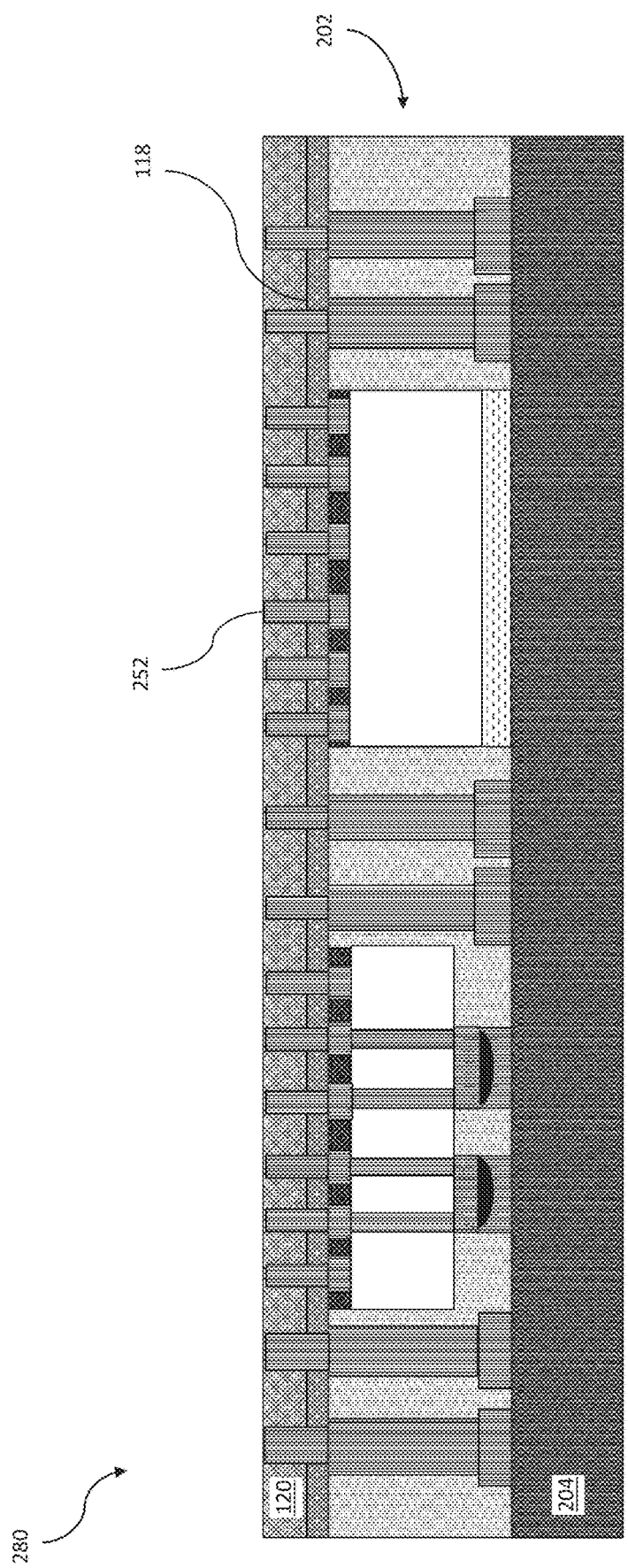
Figure 21:
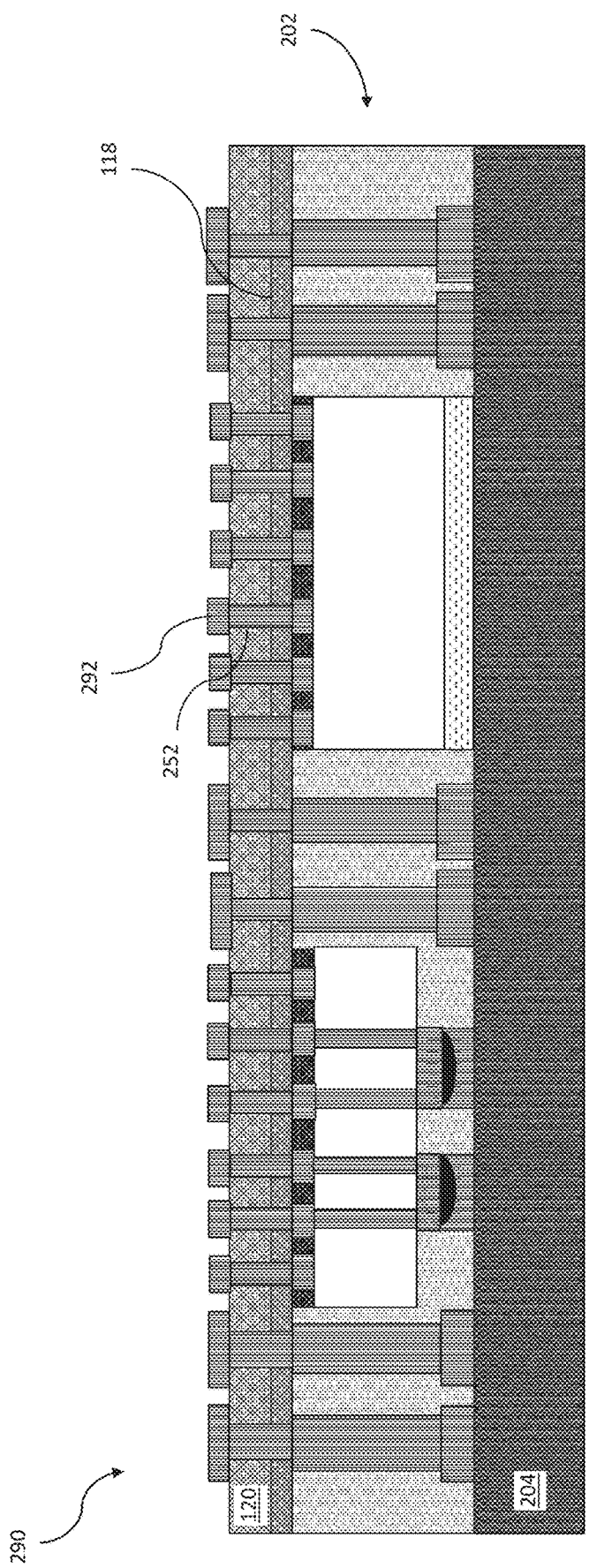

FIG. 2H illustrates an assembly 280 after organic passivation layer 120 of assembly 270 (FIG. G) has been planarized such that vias 252 are revealed through a top surface of layer 120 to enable electrical connection thereto. Planarization techniques may include but are not limited to mechanical grinding, lapping, chemical mechanical planarization (CMP), confocal laser ablation, or other confocal photolithography processes, for example.

FIG. 2I illustrates an assembly 290 after a bumping process has been performed on assembly 280 (FIG. 2H) to create bumps 292, which may correspond to bumps 126, 128

(FIG. 1), for example, for enabling electrical connection to vias 252. Bumps 292 may be created at required BPs and CDs using known lithography process or processes.

Figure 3:
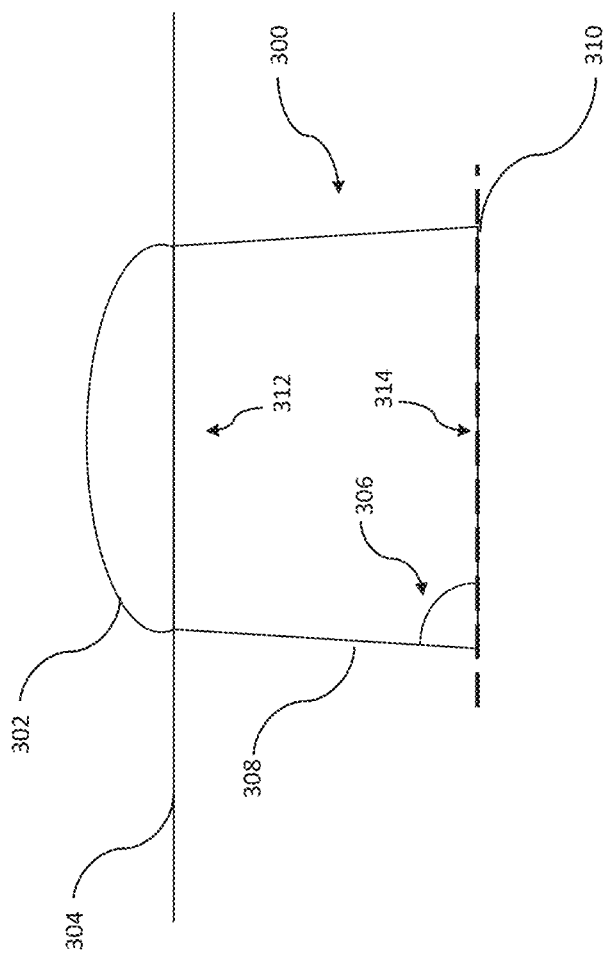
FIG. 3 is a cross-sectional illustration of vias formed through an organic passivation layer of a package component using an example method for fabricating a package component including an organic passivation layer on which DTD interconnect bumps are formed, according to some embodiments of the present disclosure.

FIG. 3 illustrates an example cross-sectional profile of a via 300 through organic passivation material created using process and techniques described with reference to and illustrated in FIGS. 2A-2I. As shown in FIG. 3, via 300 is situated below a bump 302 formed on the surface 304 of an organic passivation layer. A taper angle 306, defined as an angle between the inner portion of a side 308 of via 300 and a horizontal axis 310 in a plane substantially parallel with a bottom opening of via 300, is less than or equal to 90 degrees. As a result, the diameter of a top opening 312 of via 300 (directly under bump 302) is approximately equal to or smaller than the diameter of a bottom opening 314 of via 300.

Figure 4:
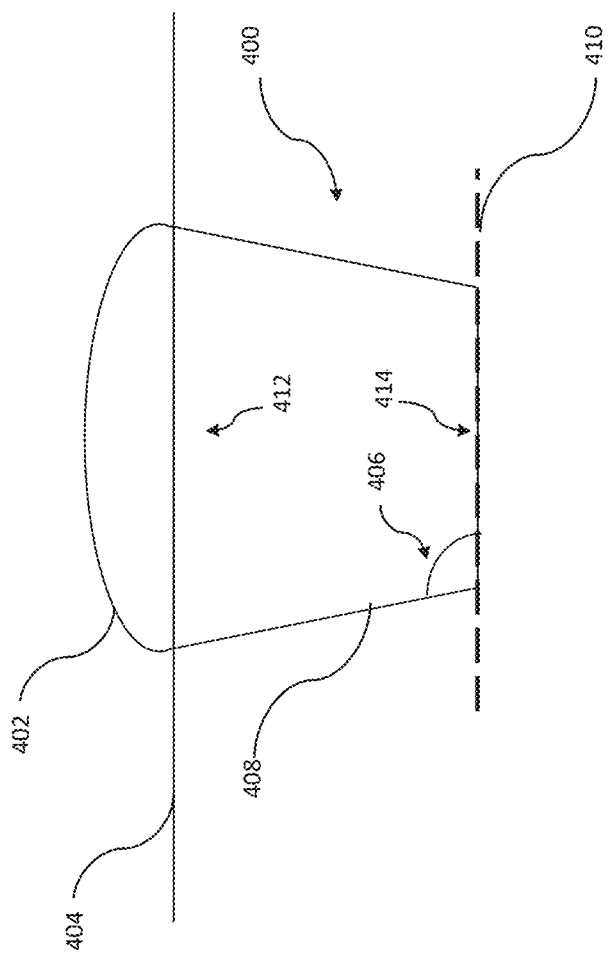
FIG. 4 is a cross-sectional illustration of vias formed in an organic passivation layer of a package component using a conventional method.

FIG. 4 illustrates an example cross-sectional profile of a via 400 through organic passivation material created using conventional processes. As shown in FIG. 4, via 400 is situated below a bump 402 formed on the surface 404 of an organic passivation layer. As shown in FIG. 4, a taper angle 406, defined as an angle between a side 408 of via 400 and a horizontal axis 410 in a plane substantially parallel with a bottom opening of via 400, is greater than 90 degrees. As a result, and as previously described, the diameter of a top opening 412 of via 400 (directly under bump 402) is greater than the diameter of a bottom opening 414 of via 400, thereby limiting both BP and minimum bump CD that can be achieved using the conventional process.

Various types of devices and/or packages may be manufactured using techniques as described herein. In some implementations, a choice of fabrication processes or other techniques may depend on how dies are coupled (e.g., using a flip-chip arrangement, or using some other arrangement). In another example, in some implementations, a choice of a technique may depend on the size, arrangement, and/or identity of the device or devices. In yet other examples, a choice of technique may depend on ease of processing and availability of various materials.

Figure 5:
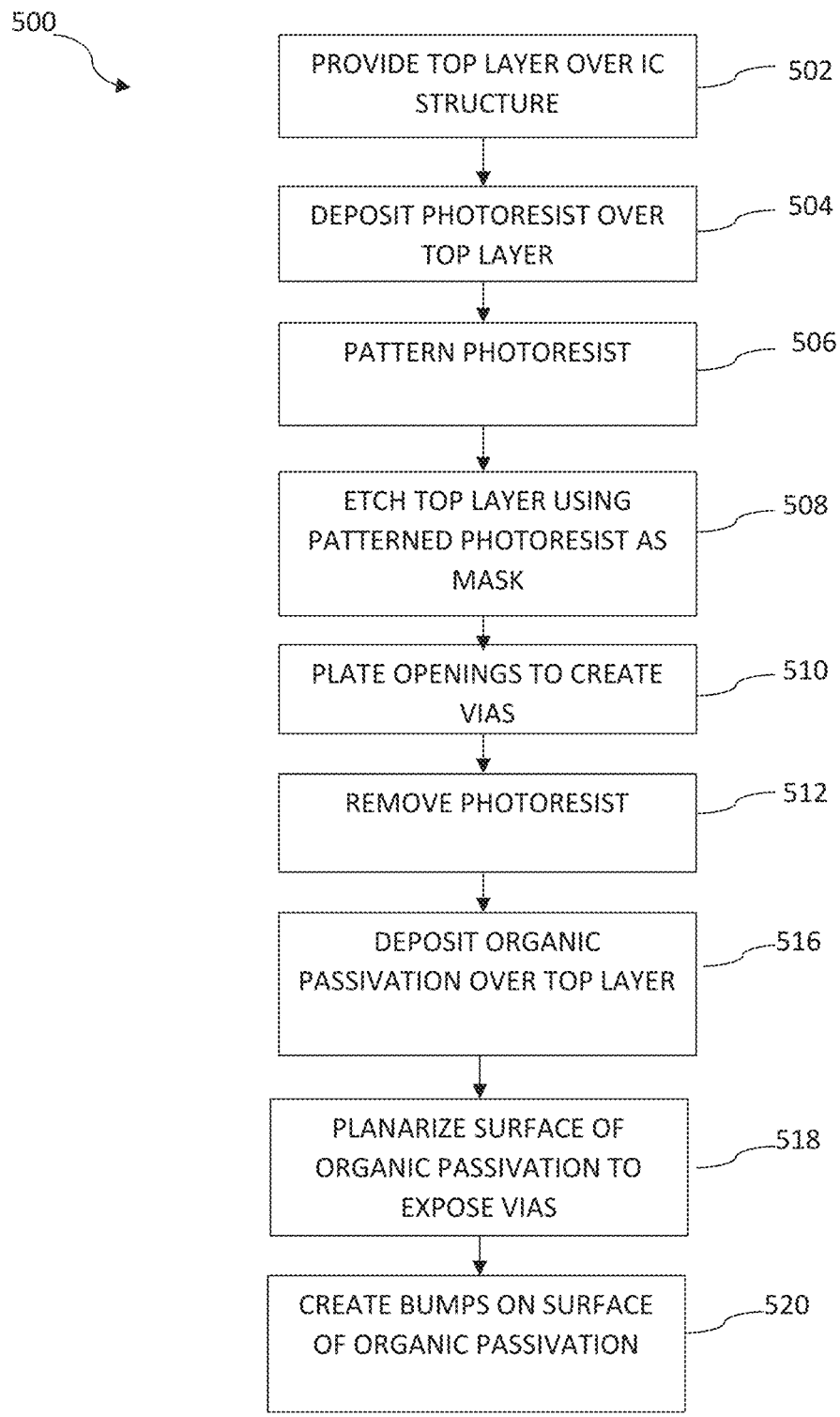
FIG. 5 is a flow diagram of an example method of fabricating a package component including an organic passivation layer on which DTD interconnect bumps are formed, according to some embodiments of the present disclosure.

FIG. 5 is a flow diagram of an example method 500 of fabricating a package component including an organic passivation layer on which DTD interconnect bumps are formed, according to various embodiments of the present disclosure.

At 502, a layer, which in some embodiments may include an inorganic material, may be formed or deposited on a top surface of an IC structure, such as IC structure 202 (as shown in FIG. 2A). In alternative embodiments, IC structure that serves as a starting point for method 500 may include a carrier wafer processed to top-most metal layer, an organic complex with or without embedded active or passive devices, a glass base with or without embedded active or passive devices, or coreless packages with a temporary carrier base with or without embedded active or passive devices. It will be recognized that, although embodiments herein are described as including an inorganic layer (which in some embodiments may perform a passivation function), inorganic layer may be omitted without departing from the spirit or scope of embodiments described herein.

At 504, a layer of photoresist material is provided over a top surface of IC structure 202 (as shown in FIG. 2B). In various embodiments, the photoresist material may be provided using any suitable deposition technique such as, but not limited to, spin-coating, dip-coating, CVD, etc. Various materials that may be used as the photoresist material are well-known in the art and, therefore, in the interests of brevity are not described herein detail. Photoresist may be deposited at any thickness necessary to achieve the appropriate via height (plus a bit extra to account for subsequent planarization of the IC structure surface). In certain embodiments, photoresist may be deposited at a thickness of approximately 3-7 micrometer.

At 506, photoresist layer provided at 504 is patterned to create a patterned to define locations and dimensions of future vias, e.g., using photolithographic patterning as known in the art (as shown in FIG. 2C).

At 508, openings are created in inorganic layer (or other top layer) between adjacent photoresist lines of patterned photoresist layer (as shown in FIG. 2D). As previously noted, creation of openings in inorganic layer may be accomplished using techniques including but not limited to dry etch (such as RF plasma, ICP, reactive ion etching (RIE), C4 plasma, and/or argon plasma) techniques and/or wet etch (such as hydrofluoric acid (HF)-based or other chemical-based) techniques, for example. In some embodiments, the etch performed at 506 may include an anisotropic etch, using etchants in a form of e.g., chemically active ionized gas (i.e., plasma) using e.g., bromine (Br) and chloride (CI) based chemistries.

At 510, openings created at 508 are plated to create vias. As previously noted, planting of openings may be performed using techniques including but not limited to electroplating of copper, plugging, and/or copper printing, for example (as shown in FIG. 2E).

At 512, the remainder of photoresist material deposited at 504 is removed from a top surface of IC structure and the top surface is cleaned as needed (as shown in FIG. 2F). In some embodiments, the remaining photoresist material may be removed using an ashing technique, where the photoresist material is exposed to oxygen or fluorine, which combines with the photoresist to form ash that can be easily removed. It will be recognized that all of the photoresist material must be removed in order to prevent failure of the device at high temperatures.

At 514, an organic passivation layer is provided over the top surface of the IC structure (as shown in FIG. 2G). As previously noted, organic passivation layer may include or may not include PI, PBO, WBR, photo-definable organic dielectrics, solder mask/solder resist, and/or non-photo-definable organic dielectrics, such as build-up dielectric materials as required for a particular application. Deposition techniques may include but are not limited to spin-on coating, slit coating, and dry film lamination, for example.

At 516, organic passivation layer is planarized such that vias are revealed through a top surface of the layer to enable electrical connection thereto (as shown in FIG. 2H). As previously noted, planarization techniques may include but are not limited to mechanical grinding, lapping, CMP, confocal laser ablation, or other confocal photolithography processes, for example.

At 518, a bumping process is performed to create bumps directly on the organic passivation layer for enabling electrical connection to underlying vias (as shown in FIG. 2I). As previously noted, bumps are created at required BPs (e.g., less than 55 micrometer) and CDs using known lithography process or processes.

Although the operations of the method 500 are illustrate in FIG. 5 once each and in a particular order, the operations may be performed in any suitable order and repeated as desired. For example, one or more operations may be performed in parallel to manufacture multiple devices and/or packages substantially simultaneously. In another example, the operations may be performed in a different order to reflect the structure of a particular package in connection with which the method 500 is implemented.

Furthermore, the operations illustrated in FIG. 5 may be combined or may include more details than described. Still further, method 500 shown in FIG. 5 may further include other manufacturing operations related to fabrication of other components of packages in connection with which the method 500 is implemented. For example, method 500 may include various cleaning operations, surface planarization operations (e.g., using CMP), operations for surface roughening, operations to include barrier and/or adhesion layers as desired, and/or operations for incorporating packages as described herein in, or with, an IC component, a computing device, or any desired structure or device.

Example Devices and Components

Figure 6:
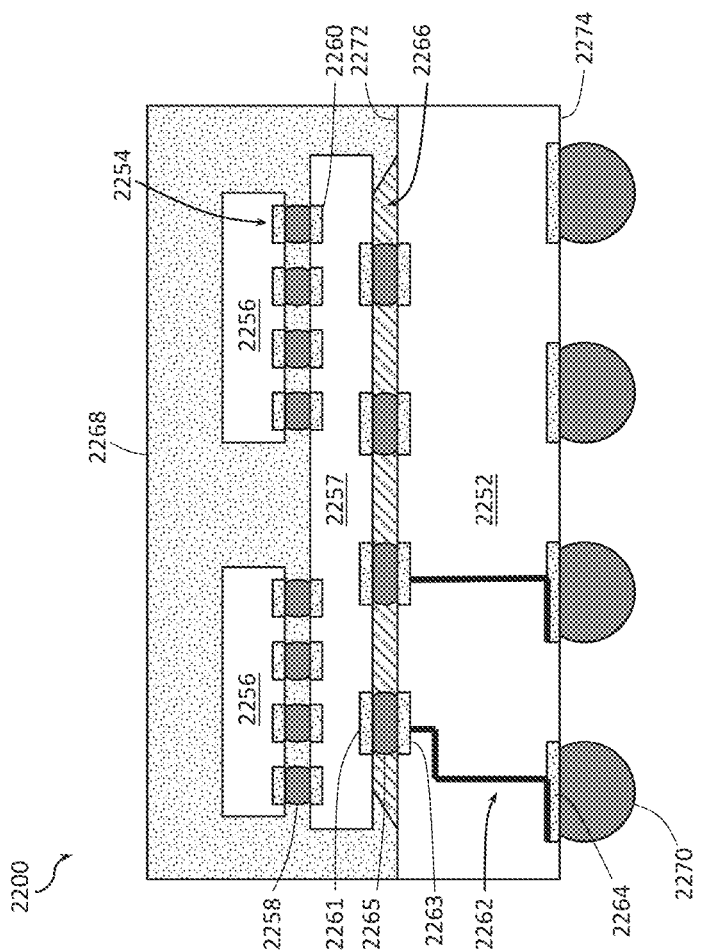
FIG. 6 is a cross-sectional view of a device package that may include one or more packages including an organic passivation layer on which DTD interconnect bumps are formed, according to some embodiments of the present disclosure.
Figure 7:
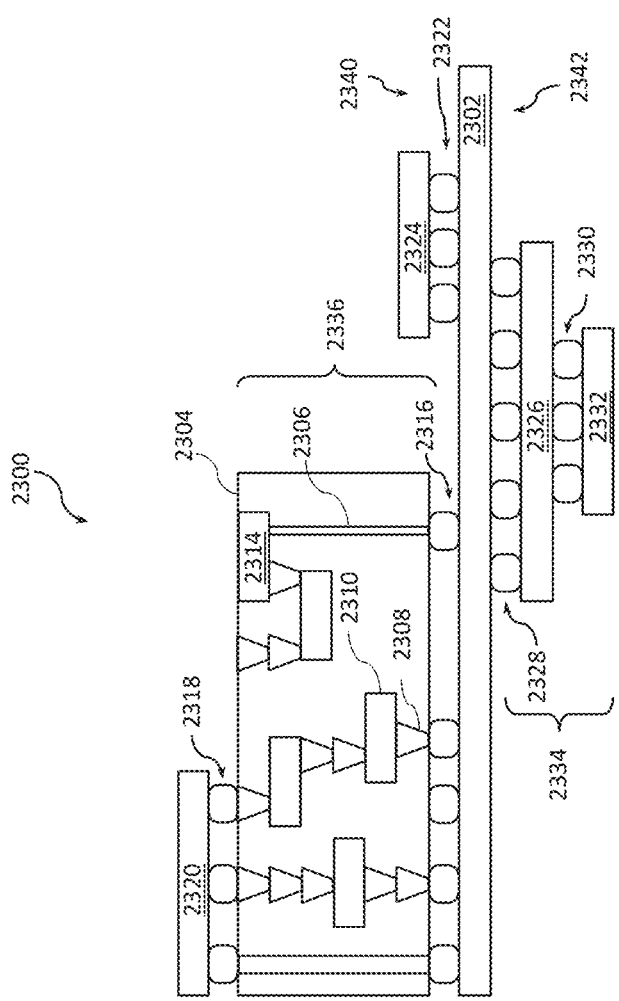
FIG. 7 is a cross-sectional side view of a device assembly that may include one or more packages including an organic passivation layer on which DTD interconnect bumps are formed, according to some embodiments of the present disclosure.
Figure 8:
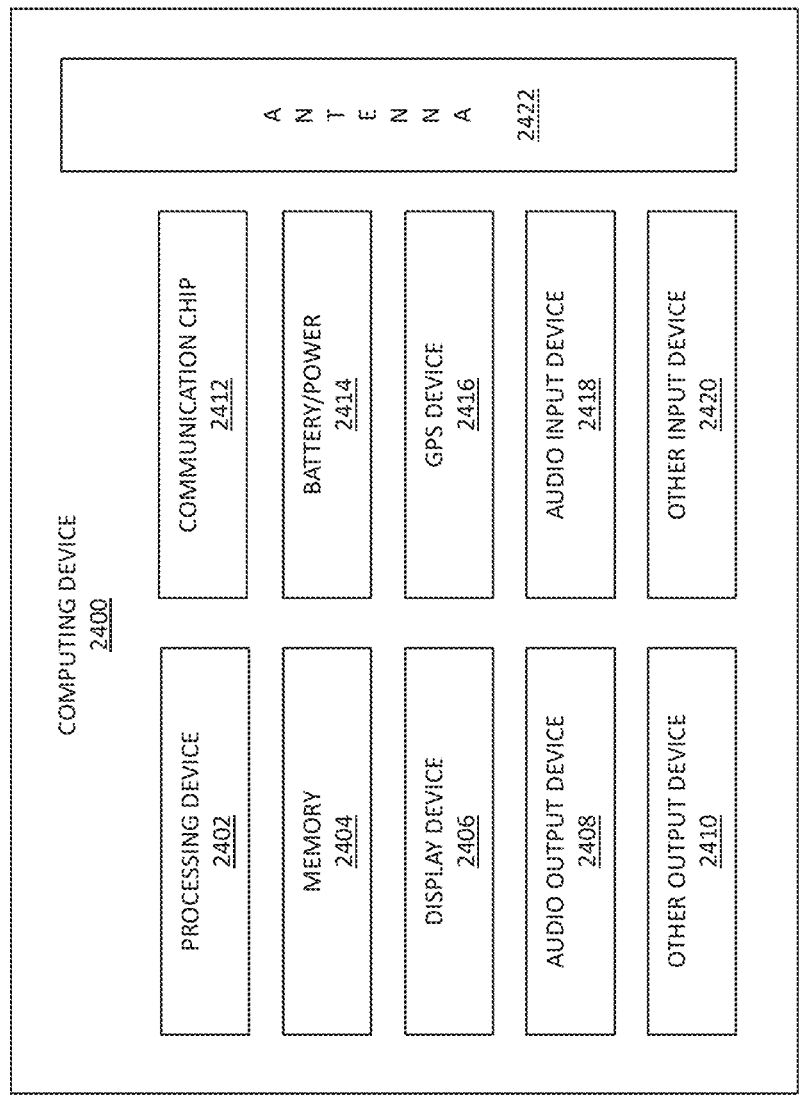
FIG. 8 is a block diagram of an example computing device that may include one or more packages including an organic passivation layer on which DTD interconnect bumps are formed, according to some embodiments of the present disclosure.

The package components disclosed herein, e.g., any of the embodiments shown in the figures or any further embodiments described herein, may be included in any suitable component. FIGS. 6-8 illustrate various examples of packages, assemblies, and devices that may be used with or include any of the package components as disclosed herein.

FIG. 6 is a side, cross-sectional view of an example IC package 2200 that may include package components in accordance with any of the embodiments disclosed herein. In some embodiments, the IC package 2200 may be a system-in-package (SiP).

As shown in FIG. 6, package support 2252 may be formed of an insulating material (e.g., a ceramic, a build-up film, an epoxy film having filler particles therein, etc.), and may have conductive pathways extending through the insulating material between first face 2272 and second face 2274, or between different locations on first face 2272, and/or between different locations on second face 2274. These conductive pathways may take the form of any of the interconnect structures comprising lines and/or vias, e.g., as discussed above with reference to the figures.

Package support 2252 may include conductive contacts 2263 that are coupled to conductive pathways 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first-level interconnects 2265, and conductive contacts 2263 of package support 2252. First-level interconnects 2265 illustrated in FIG. 6 are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in FIG. 6 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around first-level interconnects 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in FIG. 6 are solder balls (e.g., for a BGA arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 7.

In embodiments where IC package 2200 includes multiple dies 2256, IC package 2200 may be referred to as a multi-chip package (MCP). Dies 2256 may include circuitry to perform any desired functionality. For example, one or more of dies 2256 may be logic dies (e.g., silicon-based dies), one or more of dies 2256 may be memory dies (e.g., high bandwidth memory), etc.

Although IC package 2200 illustrated in FIG. 6 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 7 is a cross-sectional side view of an IC device assembly 2300 that may include components having one or more package components 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more package components 100 in accordance with any of the embodiments disclosed herein; e.g., any of the IC packages discussed below with reference to IC device assembly 2300 may take the form of any of the embodiments of IC package 2200 discussed above with reference to FIG. 6.

In some embodiments, circuit board 2302 may be a PCB including multiple metal layers separated from one another by layers of insulating material and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 7 illustrates that, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 6. In some embodiments, IC package 2320 may include at least one package component 100 as described herein. Package component 100 is not specifically shown in FIG. 7 in order to not clutter the drawing.

Although a single IC package 2320 is shown in FIG. 7, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 7, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304, for example, as shown in FIGS. 1-3.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 8 is a block diagram of an example computing device 2400 that may include one or more package components in accordance with any of the embodiments disclosed herein. For example, any one or more of the components of computing device 2400 may include any embodiments of IC package 2200 (e.g., as shown in FIG. 6). In yet another example, any one or more of the components of computing device 2400 may include an IC device assembly 2300 (e.g., as shown in FIG. 7).

A number of components are illustrated in FIG. 8 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-a-chip (SoC) die.

Additionally, in various embodiments, computing device 2400 may not include one or more of the components illustrated in FIG. 8, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408 but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides an IC package, including a package substrate; a first die over the package substrate; a stack of a first material and a second material over the first die, where the first material is between the first die and the second material, and the second material includes an organic passivation material; interconnect structures including vias on the first die and extending through the first and second materials; and conductive bumps on the second material;

and a second die over the first die and connected to the first die via the interconnect structures, where a taper angle between an inner portion of a side wall of one of the vias and a plane parallel to a bottom opening of the one of the vias is less than or equal to 90 degrees.

Example 2 provides the IC package of example 1, where the first material incudes an inorganic material.

Example 3 provides the IC package of example 2, where the inorganic material includes at least one of silicon, nitrogen, and oxygen.

Example 4 provides the IC package of any of examples 1-3, where the organic passivation material includes at least one of polyimide, polybenzoxazole, an organic dielectric, a dry film photoresist, and a solder resist.

Example 5 provides the IC package of any of examples 1-3, where a thickness of the first material is between about 1 and 2.5 micrometer and a thickness of the second material is between about 3 and 5 micrometer.

Example 6 provides the IC package of any of examples 1-3, where a pitch of the vias is less than about 55 micrometer.

Example 7 provides the IC package of example 6, where the pitch of the vias is between about 18 and about 36 micrometer.

Example 8 provides the IC package of example 6, where the pitch of the vias is about 25 micrometer.

Example 9 provides the IC package of any of examples 1-3, where a diameter of a top opening of one of the vias is less than or substantially equal to a diameter of a bottom opening of the one of the vias.

Example 10 provides the IC package of any of examples 1-3, where the vias include an electrically conductive material.

Example 11 provides the IC package of example 10, where the electrically conductive material includes copper.

Example 12 provides the IC package of any of examples 1-3, where the first die includes a single die.

Example 13 provides the IC package of any of examples 1-3, where the first die includes a multi-die package.

Example 14 provides the IC package of any of examples 1-3, where the first die includes an organic complex.

Example 15 provides the IC package of any of examples 1-3, where the first die includes a glass base.

Example 16 provides the IC package of any of examples 1-3, where the first die includes a coreless package including a temporary carrier base.

Example 17 provides the IC package of any of examples 1-3, where the first die includes an embedded device.

Example 18 provides the IC package of example 17, where the embedded device includes an active device.

Example 19 provides the IC package of example 17, where the embedded device includes a passive device.

Example 20 provides the IC package of any of examples 1-3, where the interconnect structures include DTD interconnect structures.

Example 21 provides a microelectronic assembly, including an IC structure; a stack of a first material and a second material over the IC structure, where the first material is between the IC structure and the second material, the second material includes an organic passivation material, and the first material and the second material have different material compositions; and interconnect structures including conductive vias extending through the first and second materials, where a pitch of the conductive vias is less than about 55 micrometer.

Example 22 provides the microelectronic assembly of example 21, where the interconnect structures further include conductive bumps on the layer over top openings of the vias.

Example 23 provides the microelectronic assembly of any of examples 21-22, where the first material includes an inorganic material.

Example 24 provides the microelectronic assembly of example 23, where the inorganic material includes at least one of silicon, nitrogen, and oxygen.

Example 25 provides the microelectronic assembly of any of examples 21-22, where the organic passivation material includes at least one of polyimide, polybenzoxazole, an organic dielectric, a photo-imagable dielectric, and a solder resist.

Example 26 provides the microelectronic assembly of any of examples 21-22, where the pitch of the interconnect structures is between about 18 and about 36 micrometer.

Example 27 provides the microelectronic assembly of any of examples 21-22, where the pitch of the interconnect structures is about 25 micrometer.

Example 28 provides the microelectronic assembly of any of examples 21-22, where a taper angle between a side wall of one of the vias and a plane parallel to a bottom opening of the one of the vias is less than or equal to about 90 degrees.

Example 29 provides the microelectronic assembly of any of examples 21-22, where a diameter of a top opening of one of the vias is less than or substantially equal to a diameter of a bottom opening of the one of the vias.

Example 30 provides the microelectronic assembly of any of examples 21-22, where the vias include a conductive material.

Example 31 provides the microelectronic assembly of example 30, where the conductive material includes copper.

Example 32 provides the microelectronic assembly of any of examples 21-22, where the IC structure includes a package substrate.

Example 33 provides the microelectronic assembly of any of examples 21-22, where the IC structure includes a single die.

Example 34 provides the microelectronic assembly of any of examples 21-22, where the IC structure includes a multi-die package.

Example 35 provides the microelectronic assembly of any of examples 21-22, where the IC structure includes an organic complex.

Example 36 provides the microelectronic assembly of any of examples 21-22, where the IC structure includes a glass base.

Example 37 provides the microelectronic assembly of any of examples 21-22, where the IC structure includes a coreless package including a temporary carrier base.

Example 38 provides the microelectronic assembly of any of examples 21-22, where the IC structure includes an embedded device.

Example 39 provides the microelectronic assembly of example 38, where the embedded device includes an active device.

Example 40 provides the microelectronic assembly of example 38, where the embedded device includes a passive device.

Example 41 provides the microelectronic assembly of any of examples 21-22, where the interconnect structures include DTD interconnect structures.

Example 42 provides a method of fabricating a microelectronic assembly, the method including providing a stack of a first material and a second material over an IC structure, where the first material is between the IC structure and the second material; providing a pattern to define locations and dimensions of openings to be formed in the second material; using the pattern to form the openings in the second material; removing the first material through the openings in the second material to form openings that extend through the second material and the first material; forming conductive vias by at least partially filling the openings that extend through the second material and the first material with an electrically conductive material; at least partially removing the second material surrounding portions of the conductive vias; and providing a layer including an organic passivation material surrounding the portions of the conductive vias.

Example 43 provides the method of example 42, where the first and second materials are etch-selective with respect to one another.

Example 44 provides the method of any of examples 42-43, further including removing a portion of the layer including the organic passivation material.

Example 45 provides the method of any of examples 42-43, where first layer includes an inorganic material.

Example 46 provides the method of any of examples 42-43, where the at least partially removing the second material is performed after the forming conductive vias.

Example 47 provides the method of any of examples 42-43, further including planarizing a surface of the IC structure to expose the conductive vias through the layer including the organic passivation material.

Example 48 provides the method of any of examples 42-43 further including forming conductive bumps on the organic passivation layer over the vias.

Example 49 provides the method of example 48, where a pitch of the bumps is less than about 55 micrometer.

Example 50 provides the method of example 48, where a pitch of the bumps is between about 18 and about 36 micrometer.

Example 51 provides the method of any of examples 42-43, where the conductive material includes copper.

Example 52 provides the method of any of examples 42-43, where an angle between a side wall of one of the vias and a plane parallel to a bottom opening of the one of the vias is less than or substantially equal to about 90 degrees.

Example 53 provides the method of any of examples 42-43, where a diameter of a top opening of one of the vias is less than or substantially equal to a diameter of a bottom opening of the one of the vias. The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An integrated circuit (IC) package, comprising:
 a package substrate;
 a first die over the package substrate;
 a stack of a first material and a second material over the first die, wherein the first material is between the first die and the second material, and the second material includes an organic passivation material;
 interconnect structures comprising:
  vias on the first die, wherein an individual via of the vias extends through the first and second materials; and
  conductive bumps on the second material; and
 a second die over the first die and connected to the first die via the interconnect structures,
 wherein: the individual via has a first width in a first plane and a second width in a second plane,
  the first plane and the second plane are substantially parallel with the package substrate,
  the first plane is closer to the first die than the second plane, and
  the first width is greater than the second width.

2. The IC package of claim 1, wherein the first material includes an inorganic material.

3. The IC package of claim 2, wherein the inorganic material includes at least one of silicon, nitrogen, and oxygen.

4. The IC package of claim 1, wherein the organic passivation material comprises at least one of polyimide, polybenzoxazole, an organic dielectric, a photo-imagable dielectric, and a solder resist.

5. The IC package of claim 1, wherein a first thickness of the first material is between about 1 and 2.5 micrometer and a second thickness of the second material is between about 3 and 5 micrometer.

6. The IC package of claim 1, wherein a pitch of the vias is less than about 55 micrometer.

7. The IC package of claim 1, wherein the vias include an electrically conductive material.

8. The IC package of claim 1, wherein the first die includes at least one of an organic complex, a glass base, and a coreless package including a temporary carrier base.

9. The IC package of claim 8, wherein the first die includes an embedded device comprising at least one of an active device and a passive device.

10. A microelectronic assembly, comprising:
 an integrated circuit (IC) structure;
 a stack of a first material and a second material over the IC structure, wherein the first material is between the IC structure and the second material, the second material includes an organic passivation material, and the first material and the second material have different material compositions; and
 interconnect structures comprising conductive vias extending through the first and second materials, wherein:
  a pitch of the conductive vias is less than about 55 micrometer, and
  an individual conductive via of the conductive vias has a first end proximate to the IC structure and a second end opposite the first end,
  the first end has a first width and the second end has a second width, and
  the first width is greater than the second width.

11. The microelectronic assembly of claim 10, wherein the interconnect structures further comprise conductive bumps on the second material over top openings of the conductive vias.

12. The microelectronic assembly of claim 10, wherein the first material comprises an inorganic material.

13. The microelectronic assembly of claim 12, wherein the inorganic material comprises at least one of silicon, nitrogen, and oxygen.

14. The microelectronic assembly of claim 10, wherein the organic passivation material comprises at least one of polyimide, polybenzoxazole, an organic dielectric, a photo-imageable dielectric, and a solder resist.

15. The microelectronic assembly of claim 10, wherein the pitch of the conductive vias is between about 18 and 36 micrometer.

16. The microelectronic assembly of claim 10, wherein the interconnect structures comprise die-to-die interconnect structures.

17. A method of fabricating a microelectronic assembly, the method comprising:

providing a stack of a first material and a second material over an integrated circuit (IC) structure, wherein the first material is between the IC structure and the second material;

providing a pattern to define locations and dimensions of openings to be formed in the second material;

using the pattern to form the openings in the second material;

removing the first material through the openings in the second material to form openings that extend through the second material and the first material;

forming conductive vias by at least partially filling the openings that extend through the second material and the first material with an electrically conductive material;

at least partially removing the second material surrounding portions of the conductive vias; and providing a layer comprising an organic passivation material surrounding the portions of the conductive vias.

18. The method of claim 17, wherein the first and second materials are etch-selective with respect to one another.

19. The method of claim 17, further comprising:

planarizing a surface of the IC structure to expose the conductive vias; and forming conductive bumps on the organic passivation layer over the exposed conductive vias, wherein a pitch of the conductive bumps is less than 55 micrometer.

20. The method of claim 17, wherein an angle between an inner side wall of one of the conductive vias and a plane parallel to a bottom of the one of the openings is less than or equal to 90 degrees.

* * * * *

UNITED STATES PATENT AND TRADEMARK OFFICE
CERTIFICATE OF CORRECTION

| | | |
|---|---|---|
| PATENT NO. | : 12,394,682 B2 | Page 1 of 1 |
| APPLICATION NO. | : 17/471623 | |
| DATED | : August 19, 2025 | |
| INVENTOR(S) | : Praneeth Kumar Akkinepally et al. | |

It is certified that error appears in the above-identified patent and that said Letters Patent is hereby corrected as shown below:

In the Claims

In Column 24, Claim 4, Line 19, delete "photo-imagable" and insert -- photo-imageable --, therefor.

Signed and Sealed this
Thirtieth Day of September, 2025

John A. Squires
*Director of the United States Patent and Trademark Office*